United States Patent
Matsumoto

(10) Patent No.: US 11,937,488 B2
(45) Date of Patent: Mar. 19, 2024

(54) MANUFACTURING METHOD OF DISPLAY DEVICE HAVING A LOWER PORTION OF A PARTITION BETWEEN FIRST AND SECOND APERTURES

(71) Applicant: Japan Display Inc., Tokyo (JP)

(72) Inventor: Yuko Matsumoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/460,690

(22) Filed: Sep. 5, 2023

(65) Prior Publication Data

US 2023/0413644 A1     Dec. 21, 2023

Related U.S. Application Data

(63) Continuation of application No. 18/336,048, filed on Jun. 16, 2023.

(30) Foreign Application Priority Data

Jun. 17, 2022    (JP) .................................. 2022-098019

(51) Int. Cl.
    *H10K 59/80*      (2023.01)
    *H10K 71/20*      (2023.01)

(52) U.S. Cl.
    CPC . *H10K 59/80524* (2023.02); *H10K 59/80523* (2023.02); *H10K 59/871* (2023.02); *H10K 59/879* (2023.02); *H10K 71/233* (2023.02)

(58) Field of Classification Search
    None
    See application file for complete search history.

(56) References Cited

U.S. PATENT DOCUMENTS

| | | | |
|---|---|---|---|
| 2004/0160170 | A1 | 8/2004 | Sato et al. |
| 2009/0009069 | A1 | 1/2009 | Takata |
| 2019/0363275 | A1 | 11/2019 | Ochi et al. |
| 2021/0074945 | A1* | 3/2021 | Kim ...................... H10K 50/125 |
| 2022/0077251 | A1* | 3/2022 | Choung ............... H10K 50/824 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| JP | 2014-032851 A | 2/2014 |
| WO | 2018/179308 A1 | 10/2018 |

* cited by examiner

*Primary Examiner* — Daniel Whalen
(74) *Attorney, Agent, or Firm* — XSENSUS LLP

(57) ABSTRACT

According to one embodiment, a manufacturing method of a display device includes preparing a processing substrate by forming a lower electrode, forming a rib, and forming a partition including a lower portion and an upper portion, forming an organic layer on the lower electrode, forming an upper electrode on the organic layer, forming a first transparent layer on the upper electrode, and forming a second transparent layer on the first transparent layer. The first transparent layer and the second transparent layer are formed of organic materials different from each other. A refractive index of the second transparent layer is less than a refractive index of the first transparent layer.

20 Claims, 12 Drawing Sheets

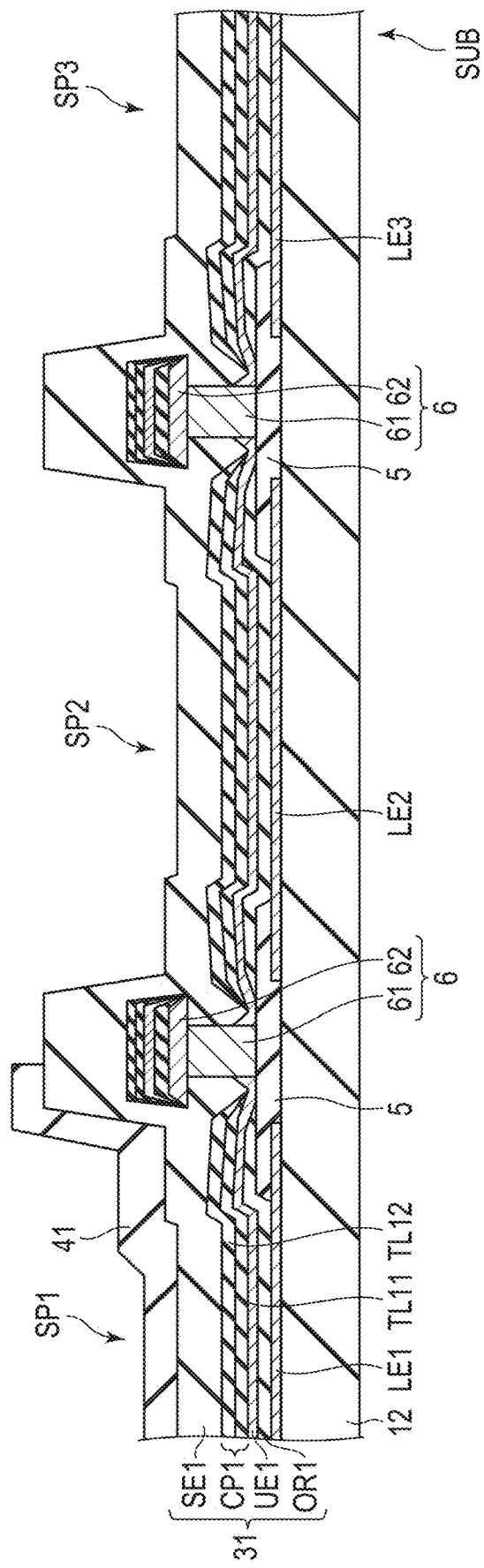
F I G. 8

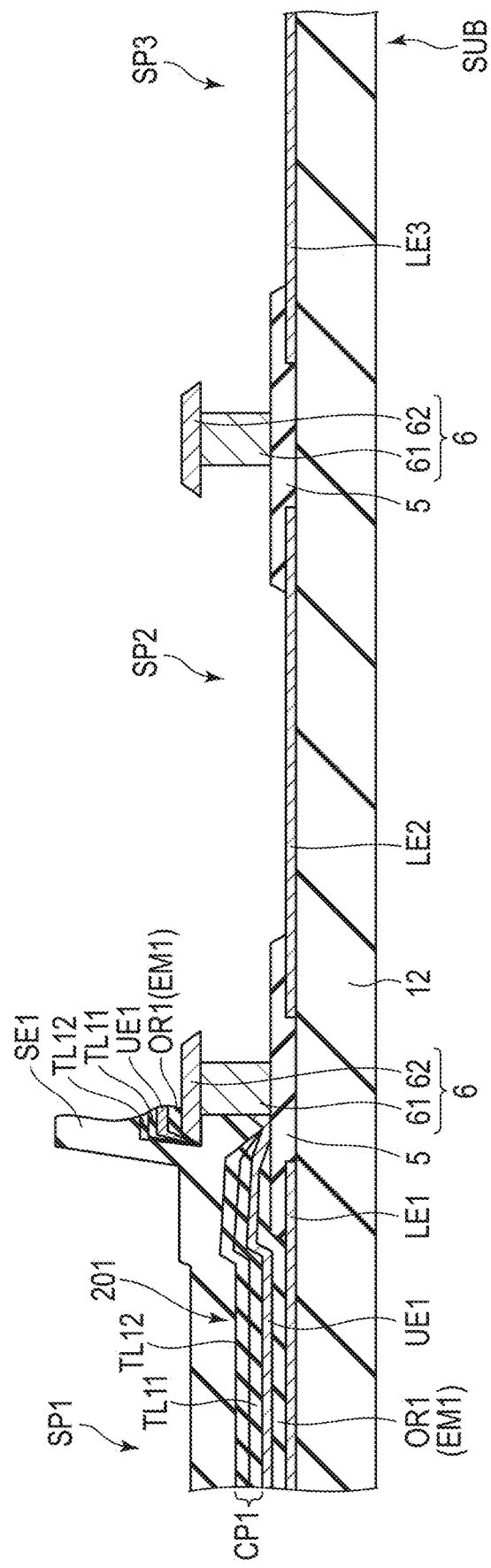
F I G. 12

MANUFACTURING METHOD OF DISPLAY DEVICE HAVING A LOWER PORTION OF A PARTITION BETWEEN FIRST AND SECOND APERTURES

CROSS-REFERENCE TO RELATED APPLICATIONS

This application is a continuation Application of U.S. application Ser. No. 18/336,048, filed Jun. 16, 2023, which is based upon and claims the benefit of priority from Japanese Patent Application No. 2022-098019, filed Jun. 17, 2022, the entire contents of each are incorporated herein by reference.

FIELD

Embodiments described herein relate generally to a display device and a manufacturing method of a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 8 is a diagram for explaining the manufacturing method of the display device DSP.

FIG. 12 is a diagram for explaining the manufacturing method of the display device DSP.

DETAILED DESCRIPTION

Figure 1:
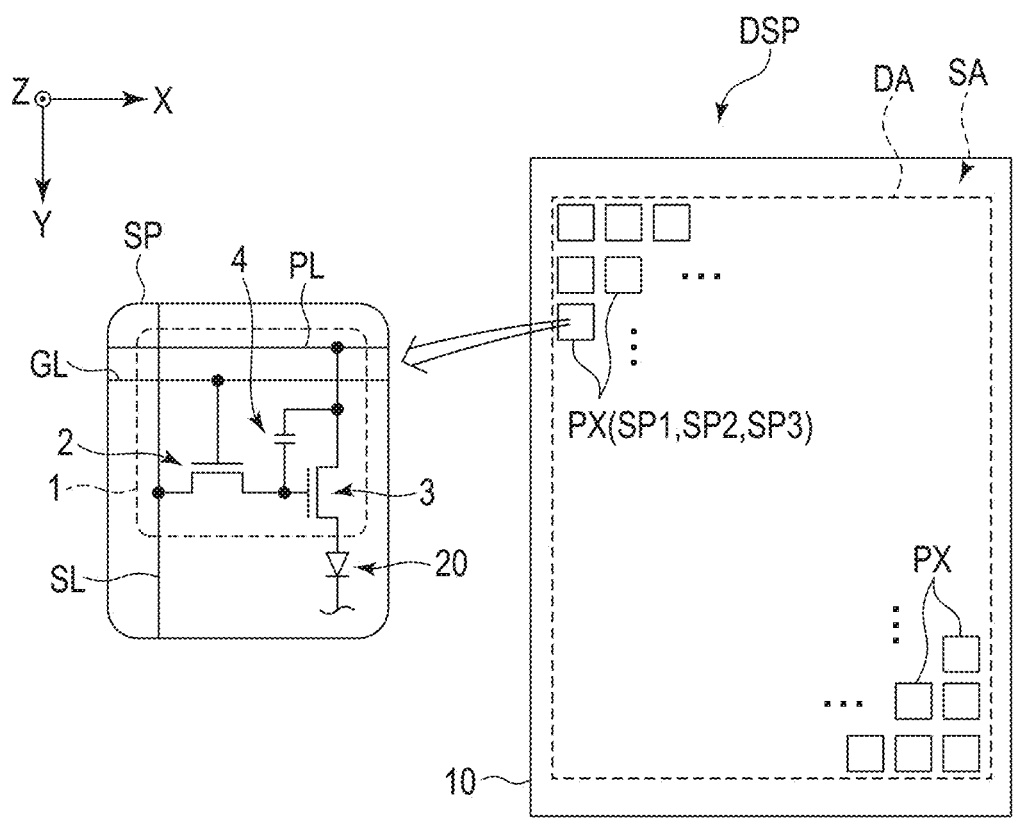
FIG. 1 is a diagram showing a configuration example of a display device DSP.

Embodiments described herein aim to provide a display device which can prevent the reduction in reliability and a manufacturing method of such a display device.

In general, according to one embodiment, a manufacturing method of a display device comprises preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion, forming an organic layer on the lower electrode in the aperture, forming an upper electrode on the organic layer, forming a first transparent layer on the upper electrode, and forming a second transparent layer on the first transparent layer. The first transparent layer and the second transparent layer are formed of organic materials different from each other. A refractive index of the second transparent layer is less than a refractive index of the first transparent layer.

According to another embodiment, a display device comprises a substrate, a lower electrode provided above the substrate, a rib formed of an inorganic insulating material and comprising an aperture overlapping the lower electrode, a partition comprising a lower portion provided on the rib and formed of a conductive material, and an upper portion provided on the lower portion and protruding from a side surface of the lower portion, an organic layer provided on the lower electrode in the aperture, an upper electrode which is provided on the organic layer and is in contact with the lower portion of the partition, a first transparent layer provided on the upper electrode, a second transparent layer provided on the first transparent layer, and a sealing layer which covers the second transparent layer and is in contact with the lower portion of the partition. The first transparent layer and the second transparent layer are formed of organic materials different from each other. A refractive index of the first transparent layer is greater than a refractive index of the second transparent layer.

The embodiments can provide a display device which can prevent the reduction in reliability and a manufacturing method of such a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Figure 2:
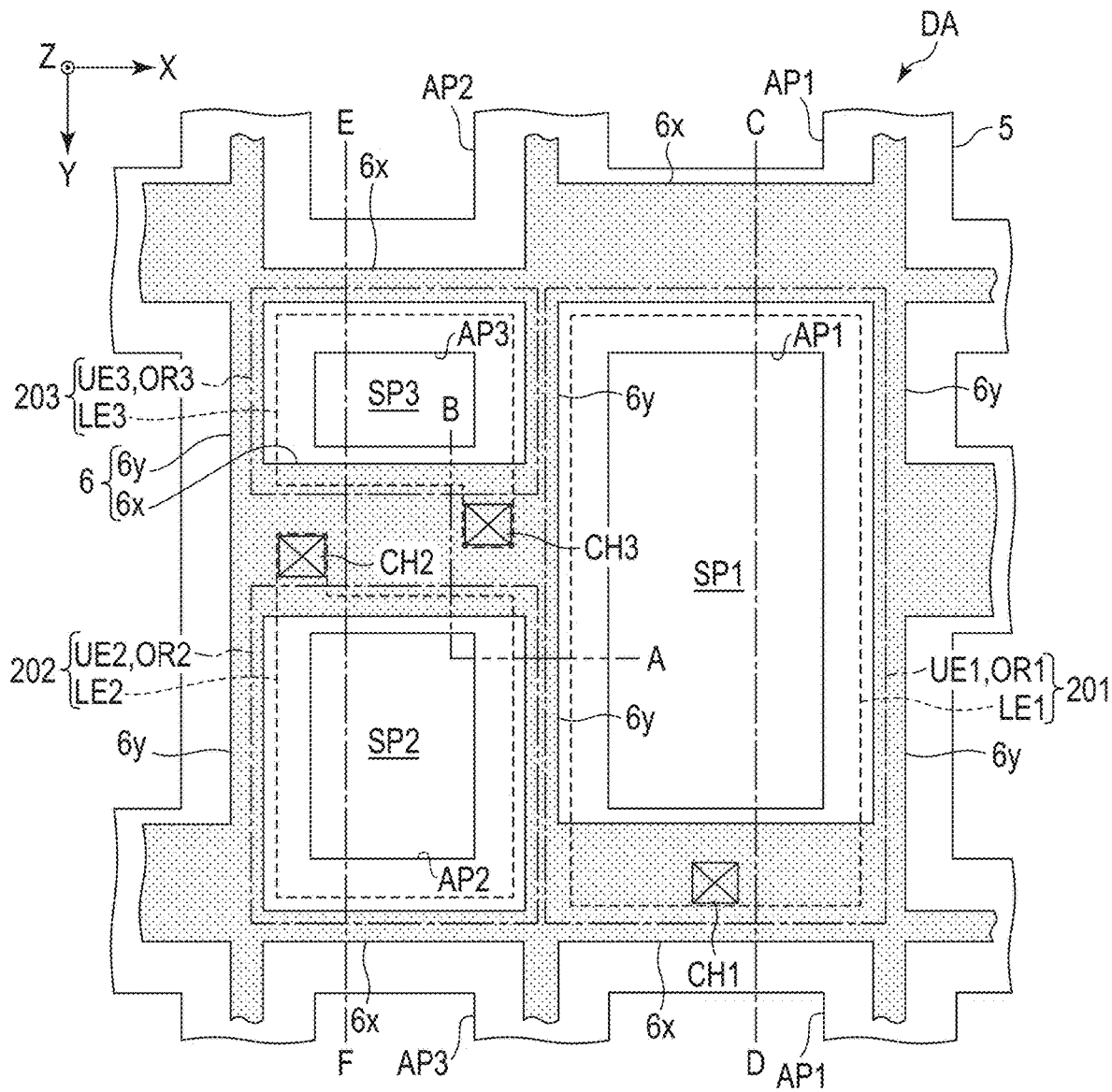
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP2 and AP3 which are adjacent to each other in the second direction Y and between two apertures AP1 which are adjacent to each other in the second direction Y. Each second partition 6y is provided between the apertures AP1 and AP2 which are adjacent to each other in the first direction X and between the apertures AP1 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

Figure 3:
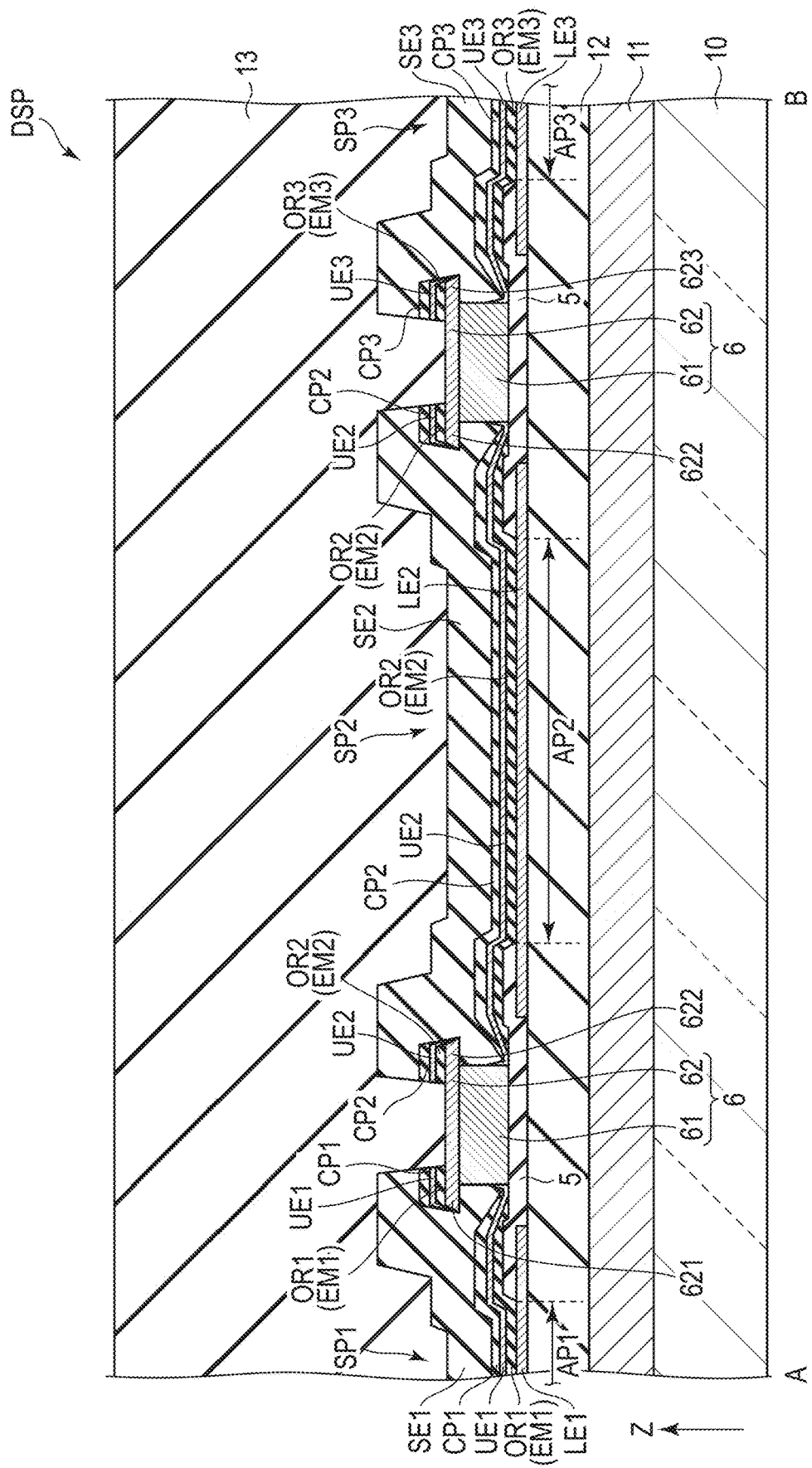
FIG. 3 is a schematic cross-sectional view of the display device DSP along the A-B line of FIG. 2.

FIG. 3 is a schematic cross-sectional view of the display device DSP along the A-B line of FIG. 2.

A circuit layer 11 is provided on the substrate 10 described above. The circuit layer 11 includes various circuits such as the pixel circuit 1, and various lines such as scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

Subpixels SP1, SP2 and SP3 further include cap layers (optical adjustment layers) CP1, CP2 and CP3 for adjusting the optical property of the light emitted from the light emitting layers of the organic layers OR1, OR2 and OR3.

The cap layer CP1 is located in the aperture AP1, is located on the lower side relative to the upper portion 62 and is provided on the upper electrode UE1. The cap layer CP2 is located in the aperture AP2, is located on the lower side relative to the upper portion 62 and is provided on the upper electrode UE2. The cap layer CP3 is located in the aperture AP3, is located on the lower side relative to the upper portion 62 and is provided on the upper electrode UE3.

Sealing layers SE1, SE2 and SE3 are provided in subpixels SP1, SP2 and SP3, respectively.

The sealing layer SE1 is in contact with the cap layer CP1 and the lower and upper portions 61 and 62 of the partition 6 and continuously covers the members of subpixel SP1.

The sealing layer SE2 is in contact with the cap layer CP2 and the lower and upper portions 61 and 62 of the partition 6 and continuously covers the members of subpixel SP2.

The sealing layer SE3 is in contact with the cap layer CP3 and the lower and upper portions 61 and 62 of the partition 6 and continuously covers the members of subpixel SP3.

The sealing layers SE1, SE2 and SE3 are covered with a protective layer 13.

In the example shown in the figure, part of the organic layer OR1, part of the upper electrode UE1 and part of the cap layer CP1 are located between the partition 6 and the sealing layer SE1, are provided on the upper portion 62 and are spaced apart from the portions located on the lower side relative to the upper portion 62.

Part of the organic layer OR2, part of the upper electrode UE2 and part of the cap layer CP2 are located between the partition 6 and the sealing layer SE2, are provided on the upper portion 62 and are spaced apart from the portions located on the lower side relative to the upper portion 62.

Part of the organic layer OR3, part of the upper electrode UE3 and part of the cap layer CP3 are located between the partition 6 and the sealing layer SE3, are provided on the upper portion 62 and are spaced apart from the portions located on the lower side relative to the upper portion 62.

The insulating layer 12 is an organic insulating layer. The rib 5 and the sealing layers SE1, SE2 and SE3 are inorganic insulating layers.

The rib 5 is formed of silicon nitride (SiNx) as an example of inorganic insulating materials. It should be noted that the rib 5 may be formed as, as another inorganic insulating material, a single-layer body of one of silicon oxide (SiOx), silicon oxynitride (SiON) and aluminum oxide ($Al_2O_3$). The rib 5 may be formed as a sacked layer body of a combination consisting of at least two of a silicon nitride layer, a silicon oxide layer, a silicon oxynitride layer and an aluminum oxide layer.

The sealing layers SE1, SE2 and SE3 are formed of, for example, the same inorganic insulating material.

The sealing layers SE1, SE2 and SE3 are formed of silicon nitride (SiNx) as an example of inorganic insulating materials. It should be noted that the sealing layers SE1, SE2 and SE3 may be formed as, as another inorganic insulating material, a single-layer body of one of silicon oxide (SiOx), silicon oxynitride (SiON) and aluminum oxide ($Al_2O_3$). Each of the sealing layers SE1, SE2 and SE3 may be formed as a stacked layer body of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The lower portion 61 of the partition 6 is formed of a conductive material and is electrically connected to the upper electrodes UE1, UE2 and UE3. The upper portion 62 of the partition 6 may be also formed of a conductive material.

The thickness of the rib 5 is sufficiently less than that of each of the partition 6 and the insulating layer 12. For example, the thickness of the rib 5 is greater than or equal to 200 nm but less than or equal to 400 nm.

The thickness of the lower portion 61 of the partition 6 (the thickness from the upper surface of the rib 5 to the lower surface of the upper portion 62) is greater than that of the rib 5.

The thickness of the sealing layer SE1, the thickness of the sealing layer SE2 and the thickness of the sealing layer SE3 are substantially equal to each other and are, for example, greater than or equal to 1 μm.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

Each of the organic layers OR1, OR2 and OR3 includes a plurality of functional layers such as a hole injection layer, a hole transport layer, an electron blocking layer, a hole blocking layer, an electron transport layer and an electron injection layer. The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the cap layers CP1, CP2 and CP3 is formed of, for example, a multilayer body of transparent thin films. As the thin films, the multilayer body includes a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3.

The protective layer 13 is formed of a multilayer body of transparent thin films. For example, as the thin films, the multilayer body includes a thin film formed of an inorganic material and a thin film formed of an organic material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a red wavelength range.

Figure 4:
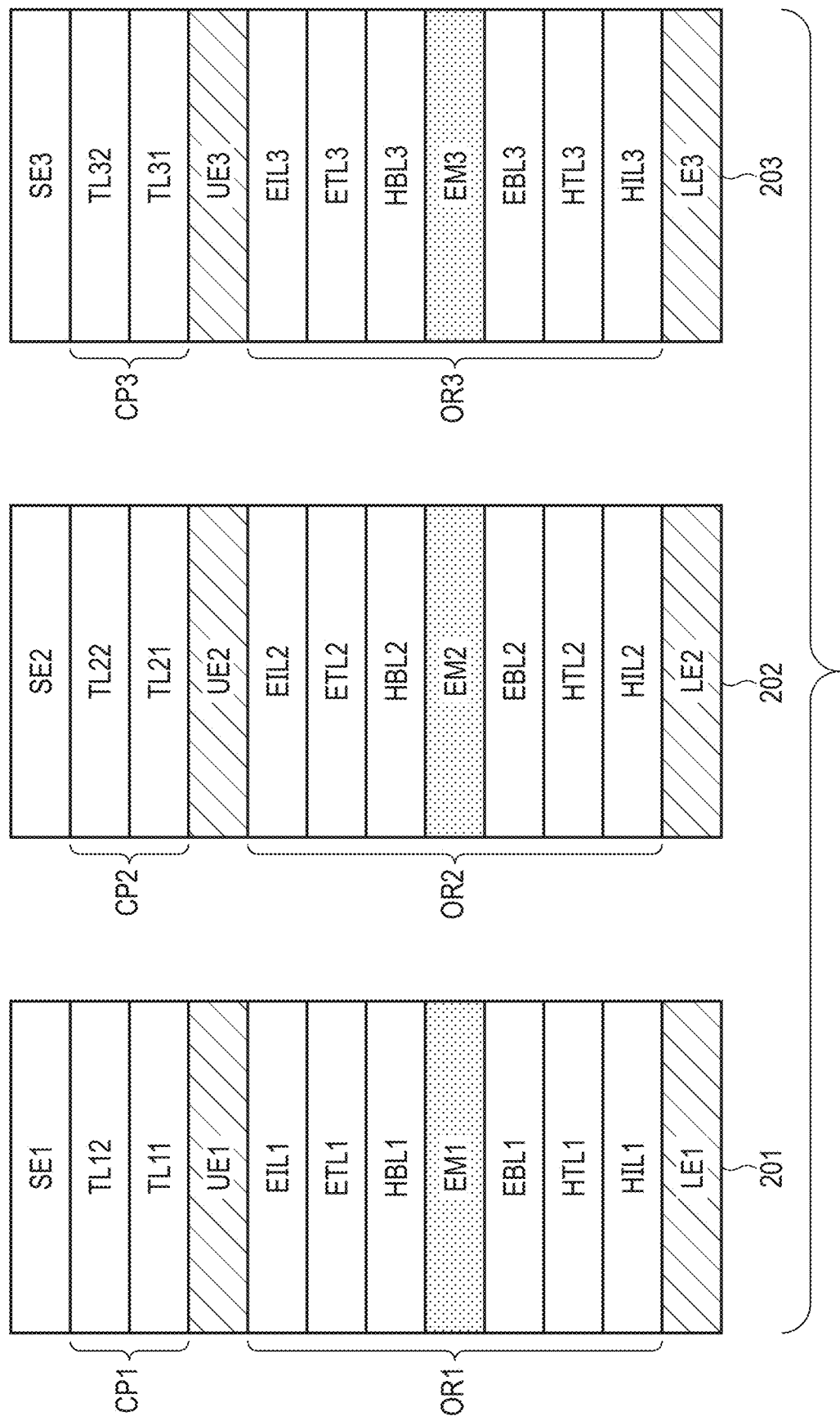
FIG. 4 is a diagram showing an example of the configuration of display elements 201 to 203.

FIG. 4 is a diagram showing an example of the configuration of the display elements 201 to 203. Here, in the example, this specification assumes that each lower electrode corresponds to an anode and each upper electrode corresponds to a cathode.

The display element 201 includes the organic layer OR1 between the lower electrode LE1 and the upper electrode UE1.

In the organic layer OR1, a hole injection layer HIL1, a hole transport layer HTL1, an electron blocking layer EBL1, the light emitting layer EM1, a hole blocking layer HBL1, an electron transport layer ETL1 and an electron injection layer EIL1 are stacked in this order.

The cap layer CP1 includes a first transparent layer TL11 and a second transparent layer TL12. The first transparent layer TL11 is provided on the upper electrode UE1. The second transparent layer TL12 is provided on the first transparent layer TL11. The sealing layer SE1 is provided on the second transparent layer TL12.

The display element 202 includes the organic layer OR2 between the lower electrode LE2 and the upper electrode UE2.

In the organic layer OR2, a hole injection layer HIL2, a hole transport layer HTL2, an electron blocking layer EBL2, the light emitting layer EM2, a hole blocking layer HBL2, an electron transport layer ETL2 and an electron injection layer EIL2 are stacked in this order.

The cap layer CP2 includes a first transparent layer TL21 and a second transparent layer TL22. The first transparent layer TL21 is provided on the upper electrode UE2. The second transparent layer TL22 is provided on the first transparent layer TL21. The sealing layer SE2 is provided on the second transparent layer TL22.

The display element 203 includes the organic layer OR3 between the lower electrode LE3 and the upper electrode UE3.

In the organic layer OR3, a hole injection layer HIL3, a hole transport layer HTL3, an electron blocking layer EBL3, the light emitting layer EM3, a hole blocking layer HBL3, an electron transport layer ETL3 and an electron injection layer EIL3 are stacked in this order.

The cap layer CP3 includes a first transparent layer TL31 and a second transparent layer TL32. The first transparent layer TL31 is provided on the upper electrode UE3. The second transparent layer TL32 is provided on the first transparent layer TL31. The sealing layer SE3 is provided on the second transparent layer TL32.

The first transparent layers TL11, TL21 and TL31 are transparent organic layers each formed of an organic material, and are high refractive layers having refractive indices greater than those of the upper electrodes UE1, UE2 and UE3. For example, the refractive index of each of the first transparent layers TL11, TL21 and TL31 is greater than or equal to 1.7 but less than or equal to 2.0.

The second transparent layers TL12, TL22 and TL32 are transparent organic layers each formed of an organic material, and are low refractive layers having refractive indices less than those of the first transparent layers TL11, TL21 and TL31. For example, the refractive index of each of the second transparent layers TL12, TL22 and TL32 is greater than or equal to 1.3 but less than or equal to 1.6.

The refractive indices of the sealing layers SE1, SE2 and SE3 which are in contact with the second transparent layers TL12, TL22 and TL32 are greater than those of the second transparent layers TL12, TL22 and TL32. For example, the refractive index of each of the sealing layers SE1, SE2 and SE3 is greater than or equal to 1.7 but less than or equal to 2.0.

As the organic material for forming the second transparent layers TL12, TL22 and TL32, fluorine resin in which the main chain consists of carbon and which contains fluorine in a substituent is desirable. For example, each of the second transparent layers TL12, TL22 and TL32 can be formed of at least one of polytetrafluoroethylene (PTFE), polyvinylidene fluoride (PVDF) and 2-(perfluorohexyl)ethyl acrylate. The refractive index of polytetrafluoroethylene is 1.35. The refractive index of polyvinylidene fluoride is 1.42. The refractive index of 2-(perfluorohexyl)ethyl acrylate is 1.35.

As another material for forming the second transparent layers TL12, TL22 and TL32, lithium fluoride can be considered. The refractive index of lithium fluoride is 1.4. It should be noted that lithium fluoride is very hygroscopic.

To the contrary, the organic materials described above such as polytetrafluoroethylene (PTFE), polyvinylidene fluoride (PVDF) and 2-(perfluorohexyl)ethyl acrylate have a less hygroscopic property compared to lithium fluoride and do not exhibit a deliquescent property. Thus, these organic materials can stably maintain the state of a thin film even if they are exposed to air.

The second transparent layers TL12, TL22 and TL32 to which these organic materials are applied can be formed by a method such as vapor deposition based on resistive heating, vapor deposition based on ion beams or sputtering. The film thickness of each of these second transparent layers TL12, TL22 and TL32 is, for example, 20 nm to 500 nm.

Each of the cap layers CP1, CP2 and CP3 described above may be a stacked layer body consisting of three or more layers.

It should be noted that each of the organic layers OR1, OR2 and OR3 may include, in addition to the functional layers described above, other functional layers such as a carrier generation layer as needed, or at least one of the above functional layers may be omitted.

The above functional layers are individually formed for each of the display elements 201 to 203. Thus, the thickness of each of the above functional layers may differ depending on the display element.

When this specification focuses attention on the same functional layer, the functional layer of one of the display elements 201 to 203 may be formed of a material different from that of the functional layers of the other two display elements, or all of the functional layers of the display elements 201 to 203 may be formed of materials different from each other.

Further, the layer structure of one of the display elements 201 to 203 may be different from that of the other two display elements, or all of the layer structures of the display elements 201 to 203 may be different from each other. For example, when this specification focuses attention on one of the functional layers, one of the display elements 201 to 203 may not include this functional layer, or only one of the display elements 201 to 203 may include the functional layer. When this specification focuses attention on one of the functional layers, for example, this functional layer may comprise a multilayer structure in one of the display elements 201 to 203.

The first transparent layers TL11, TL21 and TL31 are spaced apart from each other and are individually formed. Thus, all of the first transparent layers TL11, TL21 and TL31 may be formed of the same material, or one of the first transparent layers TL11, TL21 and TL31 may be formed of a material different from that of the other two transparent layers, or all of the first transparent layers TL11, TL21 and TL31 may be formed of materials different from each other.

The second transparent layers TL12, TL22 and TL32 are spaced apart from each other and are individually formed. Thus, all of the second transparent layers TL12, TL22 and TL32 may be formed of the same material, or one of the second transparent layers TL12, TL22 and TL32 may be formed of a material different from that of the other two transparent layers, or all of the second transparent layers TL12, TL22 and TL32 may be formed of materials different from each other.

All of the thicknesses of the first transparent layers TL11, TL21 and TL31 may be the same as each other, or may be different from each other.

All of the thicknesses of the second transparent layers TL12, TL22 and TL32 may be the same as each other, or may be different from each other.

For example, all of the thicknesses of the second transparent layers TL12, TL22 and TL32 are the same as each other. The thickness of the first transparent layer TL11 in the display element 201 for blue is less than that of the first transparent layer TL31 in the display element 203 for red.

In the display element 201, the thickness of the second transparent layer TL12 is greater than that of the first transparent layer TL11. In the display element 203, the thickness of the first transparent layer TL31 is less than that of the second transparent layer TL32.

All of the layer structures of the cap layers CP1 to CP3 may be the same as each other, or the layer structure of one of the cap layers CP1 to CP3 may be different from that of the other two cap layers, or all of the layer structures of the cap layers CP1 to CP3 may be different from each other.

In the example shown in FIG. 4, in the display element 201, the upper electrode UE1 functions as an etching stopper layer when dry etching is applied to the sealing layer SE1. In the display element 202, the upper electrode UE2 functions as an etching stopper layer when dry etching is applied to the sealing layer SE2. In the display element 203, the upper electrode UE3 functions as an etching stopper layer when dry etching is applied to the sealing layer SE3.

When dry etching is applied to each of an etching stopper layer and a sealing layer on the same condition, and the etching rate of the etching stopper layer (an upper electrode) is compared with that of the sealing layer, the etching rate of the etching stopper layer is less than that of the sealing layer. In this configuration, when dry etching is performed for a stacked layer body in which the sealing layer is stacked on the etching stopper layer, while the sealing layer is removed, the progress of etching can be stopped in the etching stopper layer.

The upper electrodes UE1, UE2 and UE3 which function as etching stopper layers are formed of a material different from the materials of the rib 5 and the sealing layers SE1, SE2 and SE3. For example, the rib 5 and the sealing layers SE1, SE2 and SE3 are formed of silicon nitride. The upper electrodes UE1, UE2 and UE3 are formed of an alloy of magnesium and silver, which is a material having a high resistance to dry etching compared to silicon nitride.

Now, this specification explains an example of the manufacturing method of the display device DSP.

Figure 5:
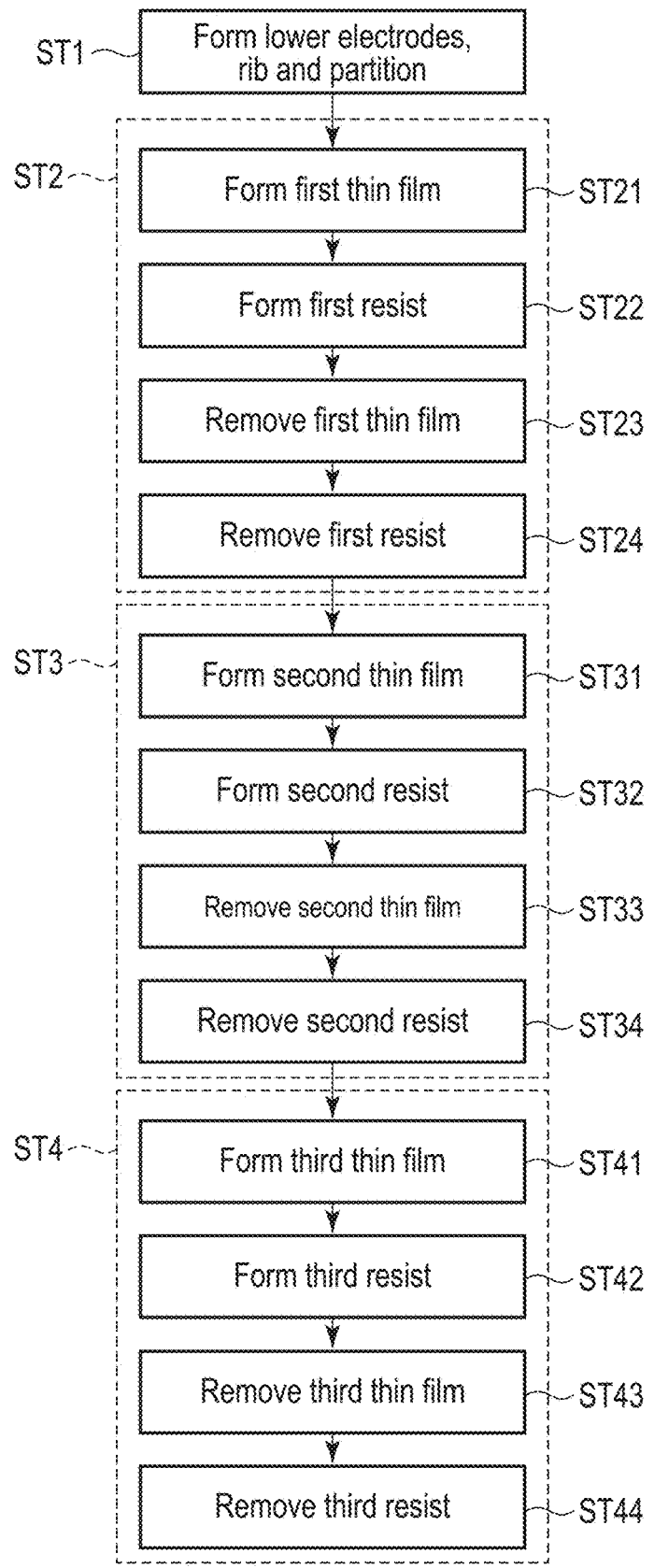
FIG. 5 is a flow diagram for explaining an example of the manufacturing method of the display device DSP.

FIG. 5 is a flow diagram for explaining an example of the manufacturing method of the display device DSP.

The manufacturing method shown here roughly includes the process of preparing a processing substrate SUB comprising subpixels SP1, SP2 and SP3 (step ST1), the process of forming the display element 201 of subpixel SP1 (step ST2), the process of forming the display element 202 of subpixel SP2 (step ST3) and the process of forming the display element 203 of subpixel SP3 (step ST4).

In step ST1, first, the processing substrate SUB is prepared by forming the lower electrode LE1 of subpixel SP1, the lower electrode LE2 of subpixel SP2, the lower electrode LE3 of subpixel SP3, the rib 5 and the partition 6 above the substrate 10. As shown in FIG. 3, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). The first thin film 31 is a stacked layer body of the organic layer OR1, upper electrode UE1, cap layer CP1 and sealing layer SE1 shown in FIG. 3. Subsequently, a first resist 41 patterned into a predetermined shape is formed on the first thin film 31 (step ST22). Subsequently, part of the first thin film 31 is removed by etching using the first resist 41 as a mask (step ST23). At this time, for example, the first thin film 31 provided in subpixel SP2 and subpixel SP3 is removed. Subsequently, the first resist 41 is removed (step ST24). In this way, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). The second thin film 32 is a stacked layer body of the organic layer OR2, upper electrode UE2, cap layer CP2 and sealing layer SE2 shown in FIG. 3. Subsequently, a second resist 42 patterned into a predetermined shape is formed on the second thin film 32 (step ST32). Subsequently, part of the second thin film 32 is removed by etching using the second resist 42 as a mask (step ST33). At this time, for example, the second thin film 32 provided in subpixel SP1 and subpixel SP3 is removed. Subsequently, the second resist 42 is removed (step ST34). In this way, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). The third thin film 33 is a stacked layer body of the organic layer OR3, upper electrode UE3, cap layer CP3 and sealing layer SE3 shown in FIG. 3. Subsequently, a third resist 43 patterned into a predetermined shape is formed on the third thin film 33 (step ST42). Subsequently, part of the third thin film 33 is removed by etching using the third resist 43 as a mask (step ST43). At this time, for example, the third thin film 33 provided in subpixel SP1 and subpixel SP2 is removed. Subsequently, the third resist 43 is removed (step ST44). In this way, subpixel SP3 is formed. Subpixel SP3 comprises the display element 203 comprising the third thin film 33 having a predetermined shape.

The detailed illustrations of the second thin film 32, the second resist 42, the third thin film 33 and the third resist 43 are omitted.

Now, this specification explains step ST1 and step ST2 with reference to FIG. 6 to FIG. 12. The section shown in each of FIG. FIG. 6 to FIG. 12 corresponds to, for example, the section taken along the A-B line of FIG. 2.

Figure 6:
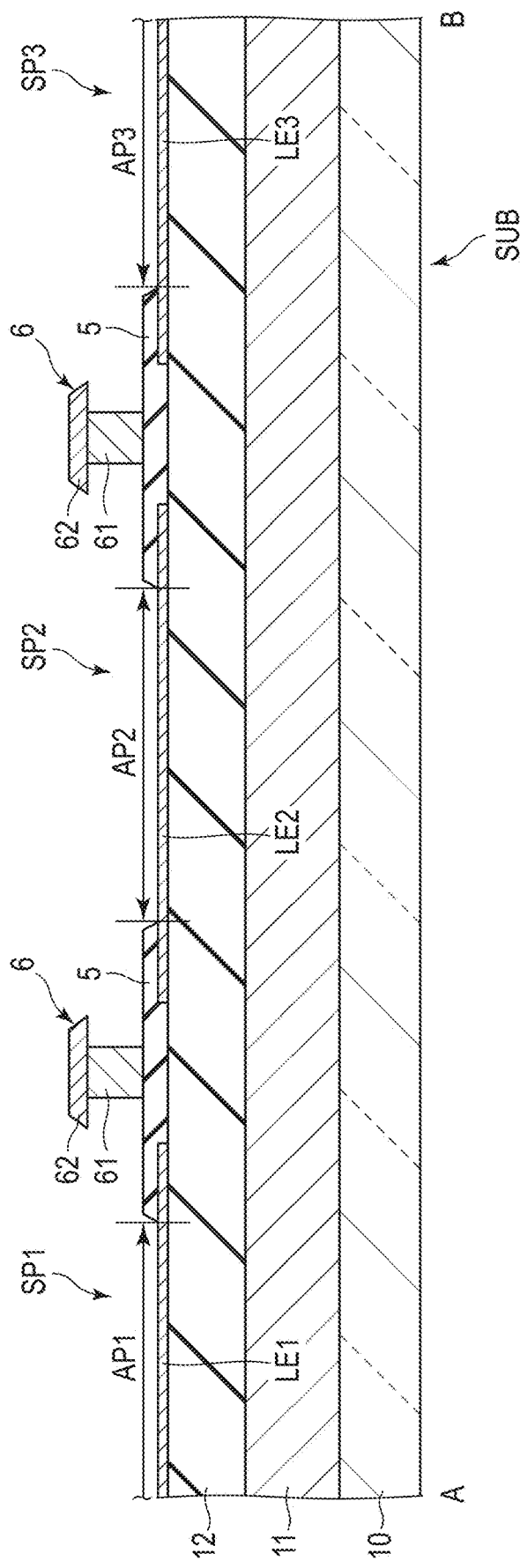
FIG. 6 is a diagram for explaining the manufacturing method of the display device DSP.

First, in step ST1, as shown in FIG. 6, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61. In each of FIG. 7 to FIG. 12, the illustrations of the substrate 10 and the circuit layer 11 lower than the insulating layer 12 are omitted.

The rib 5 is formed of, for example, silicon nitride.

Of the partition 6, at least the lower portion 61 is formed of a conductive material.

Figure 7:
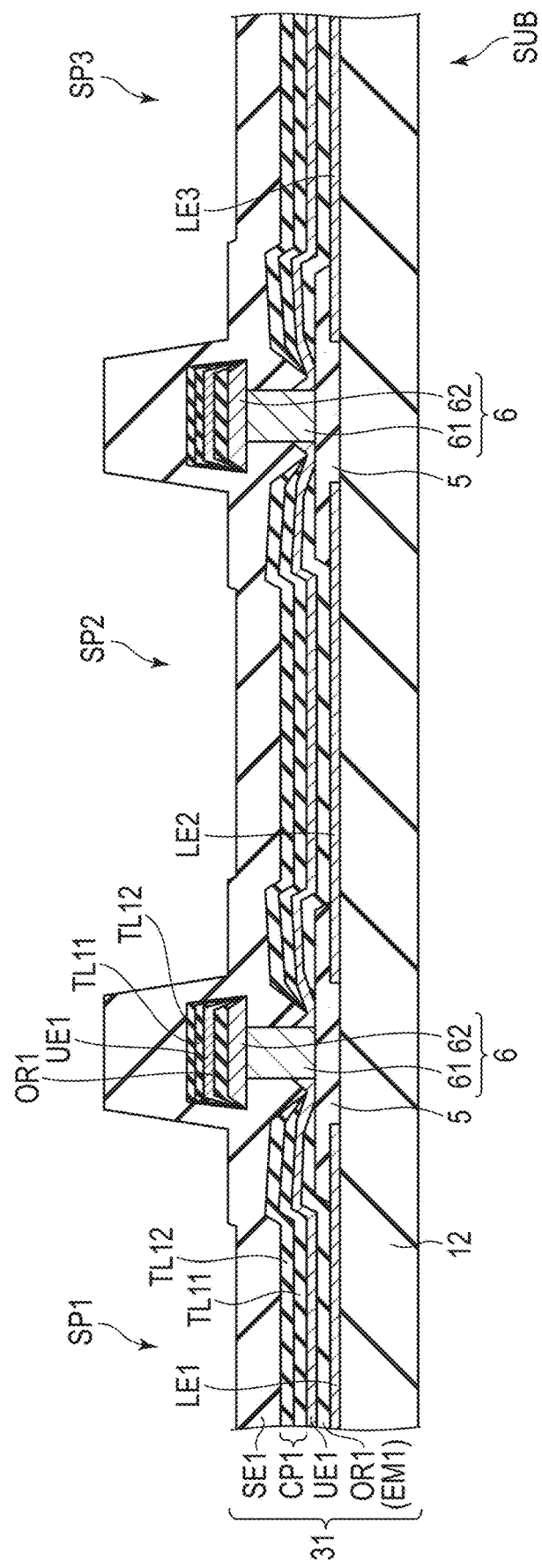
FIG. 7 is a diagram for explaining the manufacturing method of the display device DSP.

Subsequently, in step ST21, as shown FIG. 7, the first thin film 31 is formed over subpixel SP1, subpixel SP2 and subpixel SP3. The process of forming the first thin film 31 includes, on the processing substrate SUB, the process of forming the organic layer OR1 including the light emitting layer EM1, the process of forming the upper electrode UE1 on the organic layer OR1, the process of forming the first transparent layer TL11 of the cap layer CP1 on the upper electrode UE1, the process of forming the second transparent layer TL12 of the cap layer CP1 on the first transparent layer TL11 and the process of forming the sealing layer SE1 on the second transparent layer TL12. Thus, in the example shown in the figure, the first thin film 31 includes the organic layer OR1, the upper electrode UE1, the cap layer CP1 and the sealing layer SE1.

The organic layer OR1 is formed on each of the lower electrode LE1, the lower electrode LE2 and the lower electrode LE3 and is also formed on the partition 6. Of the organic layer OR1, the portion formed on each upper portion 62 is spaced apart from the portion formed on each of the lower electrodes LE1, LE2 and LE3. The various functional layers and the light emitting layer EM1 of the organic layer OR1 are formed by a vapor deposition method.

The upper electrode UE1 is formed on the organic layer OR1 immediately above each of the lower electrodes LE1, LE2 and LE3, covers the rib 5 and is in contact with the lower portions 61 of the partition 6. The upper electrode UE1 is also formed on the organic layer OR1 immediately above each upper portion 62. Of the upper electrode UE1, the portion which is formed immediately above each upper portion 62 is spaced apart from the portion which is formed immediately above each of the lower electrodes LE1, LE2 and LE3. The upper electrode UE1 is formed of an alloy of magnesium and silver by a vapor deposition method.

The first transparent layer TL11 of the cap layer CP1 is formed on the upper electrode UE1 immediately above each of the lower electrodes LE1, LE2 and LE3, and is also formed on the upper electrode UE1 immediately above each upper portion 62. Of the first transparent layer TL11, the portion which is formed immediately above each upper portion 62 is spaced apart from the portion which is formed immediately above each of the lower electrodes LE1, LE2 and LE3. For example, the first transparent layer TL11 is formed of an organic material by a vapor deposition method.

The second transparent layer TL12 of the cap layer CP1 is formed on the first transparent layer TL11 immediately above each of the lower electrodes LE1, LE2 and LE3, and is also formed on the first transparent layer TL11 immediately above each upper portion 62. Of the second transparent layer TL12, the portion which is formed immediately above each upper portion 62 is spaced apart from the portion which is formed immediately above each of the lower electrodes LE1, LE2 and LE3. For example, the second transparent layer TL12 is formed of an organic material by a vapor deposition method. The second transparent layer TL12 is formed of an organic material which is different from the first transparent layer TL11. Further, the refractive index of the second transparent layer TL12 is less than that of the first transparent layer TL11.

The sealing layer SE1 is formed so as to cover the second transparent layer TL12 and the partition 6. In other words, the sealing layer SE1 is formed on the second transparent layer TL12 immediately above each of the lower electrodes LE1, LE2 and LE3, and is also formed on the second transparent layer TL12 immediately above each upper portion 62. Moreover, the sealing layer SE1 is in contact with the lower portion 61 of the partition 6. In the sealing layer SE1, the portion which is formed immediately above each upper portion 62 is continuous with the portion which is formed immediately above each of the lower electrodes. The sealing layer SE1 is formed of, for example, silicon nitride. The sealing layer SE1 is formed by, for example, a CVD method.

Subsequently, in step ST22, as shown in FIG. 8, the patterned first resist 41 is formed on the sealing layer SE1. The first resist 41 covers the first thin film 31 of subpixel SP1, and the first thin film 31 is exposed from the first resist 41 in subpixels SP2 and SP3. Thus, the first resist 41 overlaps the sealing layer SE1 located immediately above the lower electrode LE1. The first resist 41 extends from subpixel SP1 to the upper side of the partition 6. On the partition 6 between subpixel SP1 and subpixel SP2, the first resist 41 is provided on the subpixel SP1 side (the left side of the figure), and the sealing layer SE1 is exposed from the first resist 41 on the subpixel SP2 side (the right side of the figure). The sealing layer SE1 is exposed from the first resist 41 in subpixel SP2 and subpixel SP3.

Figure 9:
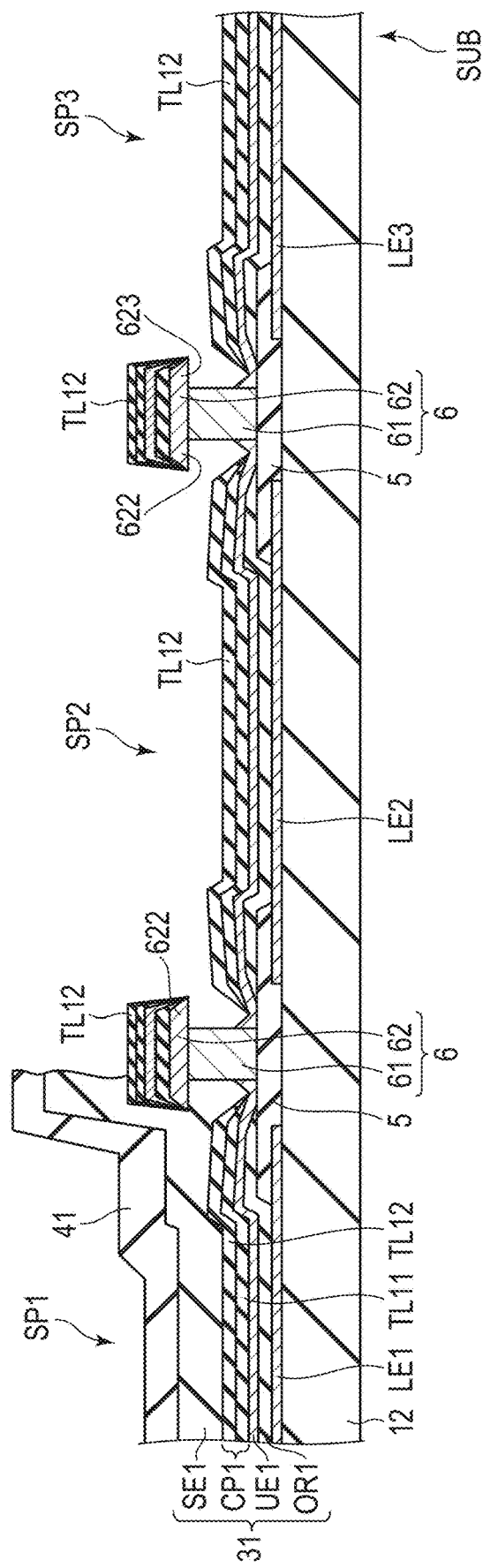
FIG. 9 is a diagram for explaining the manufacturing method of the display device DSP.
Figure 10:
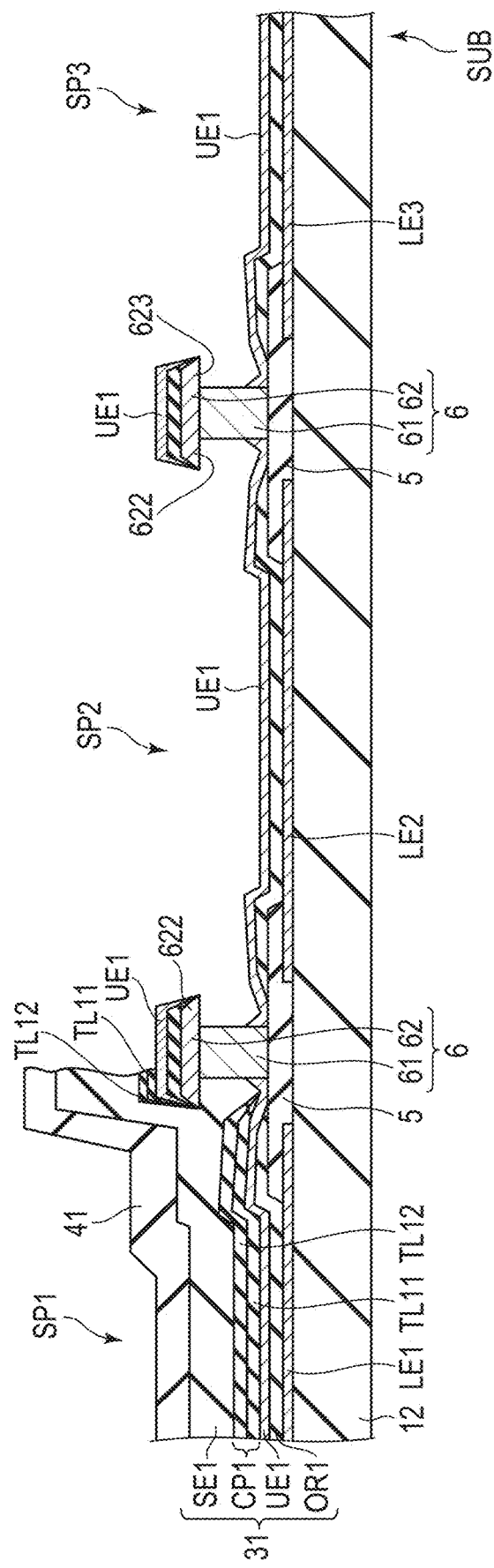
FIG. 10 is a diagram for explaining the manufacturing method of the display device DSP.
Figure 11:
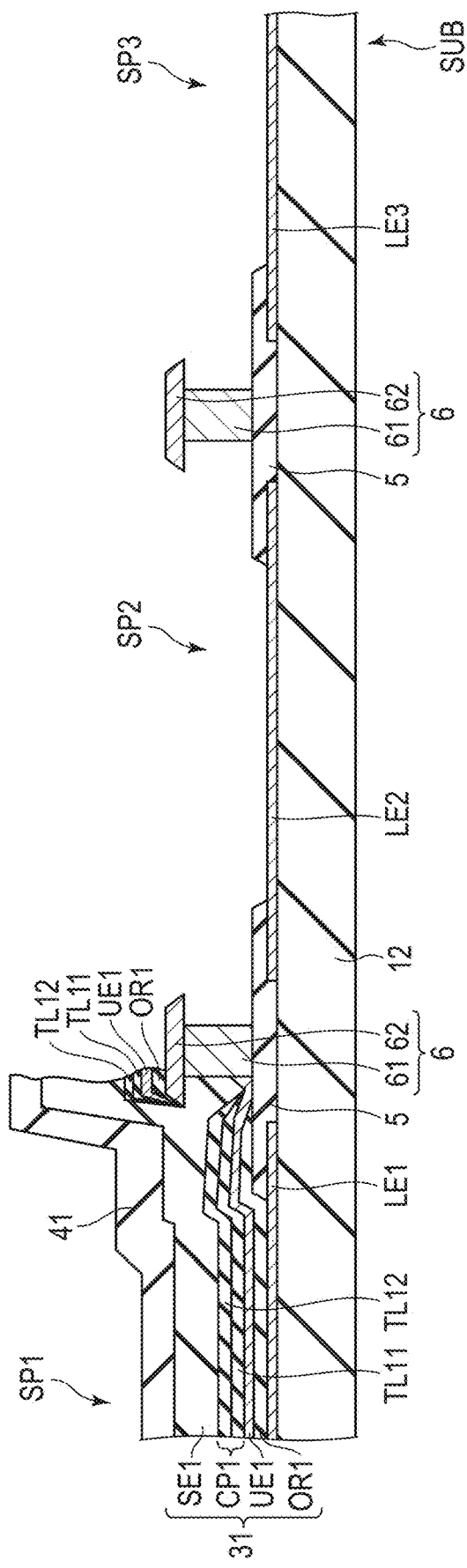
FIG. 11 is a diagram for explaining the manufacturing method of the display device DSP.

Subsequently, in step ST23, as shown in FIG. 9 to FIG. 11, etching is applied using the first resist 41 as a mask. By this process, the first thin film 31 exposed from the first resist 41 in subpixels SP2 and SP3 is removed, and the first thin film 31 remains in subpixel SP1.

The process of removing the first thin film 31 is, for example, as follows.

First, as shown in FIG. 9, dry etching is performed using the first resist 41 as a mask to remove the sealing layer SE1 exposed from the first resist 41. By this process, of the cap layer CP1, part of the second transparent layer TL12 is exposed from the sealing layer SE1.

Subsequently, as shown in FIG. 10, ashing (dry etching for emitting oxygen plasma) is performed using the first resist 41 as a mask to remove the second transparent layer TL12 exposed from the sealing layer SE1.

Subsequently, ashing is performed using the first resist 41 as a mask to remove the first transparent layer TL11 exposed from the second transparent layer TL12. By this process, part of the upper electrode UE1 is exposed from the cap layer CP1.

Subsequently, as shown in FIG. 11, wet etching is performed using the first resist 41 as a mask to remove the upper electrode UE1 exposed from the first transparent layer TL11.

Subsequently, ashing is performed using the first resist 41 as a mask to remove the organic layer OR1 exposed from the upper electrode UE1.

In this way, the lower electrode LE2 is exposed in subpixel SP2, and the rib 5 surrounding the lower electrode LE2 is exposed. In subpixel SP3, the lower electrode LE3 is exposed, and the rib 5 surrounding the lower electrode LE3 is exposed. Of the partition 6 between subpixel SP1 and subpixel SP2, the subpixel SP2 side is exposed. Further, the partition 6 between subpixel SP2 and subpixel SP3 is exposed.

Subsequently, in step ST24, as shown in FIG. 12, the first resist 41 is removed. Thus, the sealing layer SE1 of subpixel SP1 is exposed. Through these steps ST21 to ST24, the display element 201 is formed in subpixel SP1. The display element 201 consists of the lower electrode LE1, the organic layer OR1 including the light emitting layer EM1, the upper electrode UE1, the first transparent layer TL11 and the second transparent layer TL12. The display element 201 is covered with the sealing layer SE1.

A stacked layer body of the organic layer OR1 including the light emitting layer EM1, the upper electrode UE1, the first transparent layer TL11, the second transparent layer TL12 and the sealing layer SE1 is formed on the partition 6 between subpixel SP1 and subpixel SP2. The stacked layer body located on the partition 6 is spaced apart from the organic layer OR1, the upper electrode UE1, the first transparent layer TL11, the second transparent layer TL12 and the sealing layer SE1 constituting the display element 201. Of the partition 6, the portion on the subpixel SP1 side is covered with the sealing layer SE1. It should be noted that the stacked layer body on the partition 6 shown in FIG. 12 is completely removed in some cases.

Steps ST31 to ST34 shown in FIG. 5 are similar to steps ST21 to ST24 described above. Through these steps ST31 to ST34, the display element 202 is formed in subpixel SP2 shown in FIG. 3. The display element 202 consists of the lower electrode LE2, the organic layer OR2 including the light emitting layer EM2, the upper electrode UE2, the first transparent layer TL21 and the second transparent layer TL22. The display element 202 is covered with the sealing layer SE2.

Steps ST41 to ST44 shown in FIG. 5 are also similar to steps ST21 to ST24 described above. Through these steps ST41 to ST44, the display element 203 is formed in subpixel SP3 shown in FIG. 3. The display element 203 consists of the lower electrode LE3, the organic layer OR3 including the light emitting layer EM3, the upper electrode UE3, the first transparent layer TL31 and the second transparent layer TL32. The display element 203 is covered with the sealing layer SE3.

In the present embodiment, the display elements 201 to 203 comprise the cap layers CP1 to CP3, respectively, which function as optical adjustment layers. Thus, the light emitted from the light emitting layers EM1 to EM3 is reflected on the interface between the first and second transparent layers constituting the cap layers CP1 to CP3, respectively, and is reflected on the upper electrode again. By the microcavity effect using such interference of reflected light, the light extraction efficiency for each display element can be improved.

This optical adjustment layer is formed as a stacked layer body consisting of a low refractive layer and a high refractive layer. In the manufacturing method of the display device described above, the first to third thin films each including the optical adjustment layer are patterned for each subpixel. At this time, as each layer constituting the optical adjustment layer is formed of an organic material, the layers can be easily and continuously removed by an ashing process. In addition, in the ashing process, oxygen plasma is emitted while spreading. Therefore, as shown in FIG. 9, both the low refractive layer and the high refractive layer can be assuredly removed immediately under the protrusion 622 of the partition 6 and immediately under the protrusion 623 of the partition 6. Thus, the generation of the residue of the organic materials is prevented, thereby preventing the reduction in reliability.

Further, as the organic material for forming each of the low refractive layer and the high refractive layer, a material having a high transparency and a predetermined refractive index can be applied. Thus, the number of choices for the applicable materials is increased. When the organic material is removed, an ashing process is applied. Further, the low refractive layer and the high refractive layer can be continuously removed. Thus, the process becomes more flexible and the processing time is also shortened compared to wet etching for removing the layers by a predetermined etchant.

As explained above, the present embodiment can provide a display device which can prevent the reduction in reliability and have an improved manufacturing yield, and a manufacturing method thereof.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A manufacturing method of a display device, comprising:
   preparing a processing substrate by
      forming a first lower electrode and a second lower electrode above a substrate,
      forming a rib on the first lower electrode and the second lower electrode, the rib being formed of a first inorganic insulating material and including a first aperture overlapping the first lower electrode and a second aperture overlapping the second lower electrode, and
      forming a partition on the rib, the partition including
         a lower portion on the rib and between the first aperture and the second aperture, and
         an upper portion on the lower portion and extending beyond a side surface of the lower portion;
   forming a first organic layer on the rib and the partition, the first organic layer including a first light-emitting layer and being in contact with the first lower electrode at the first aperture;
   forming a first upper electrode on the first organic layer;
   forming a first transparent layer on the first upper electrode, the first transparent layer being formed of a first organic material;
   forming a second transparent layer on the first transparent layer, the second transparent layer being formed of a second organic material different from the first organic material;
   forming a first sealing layer on the second transparent layer, the first sealing layer being formed of a second inorganic insulating material;
   forming a first patterned resist on the first sealing layer, the first patterned resist covering a first portion of the first sealing layer above the first lower electrode and a second portion of the first sealing layer above a first part of the upper portion of the partition, and the first patterned resist exposing a third portion of the first sealing layer above the second lower electrode and a fourth portion of the first sealing layer above a second part of the upper portion of the partition;
   removing the third portion of the first sealing layer to expose a partition portion of the second transparent layer and a pixel portion of the second transparent layer by a first dry etching, the partition portion of the second transparent layer overlapping the upper portion of the partition in a plan view and the pixel portion of the second transparent layer overlapping the second lower electrode in the plan view;
   removing the partition portion of the second transparent layer and the pixel portion of the second transparent layer to expose a partition portion of the first transparent layer and a pixel portion of the first transparent layer by a second dry etching using an oxygen plasma, the partition portion of the first transparent layer overlapping the upper portion of the partition in the plan view and the pixel portion of the first transparent layer overlapping the second lower electrode in the plan view;
   removing the partition portion of the first transparent layer and the pixel portion of the first transparent layer to expose a partition portion of the first upper electrode and a pixel portion of the first upper electrode by the second dry etching, the partition portion of the first upper electrode overlapping the upper portion of the partition in the plan view, and the pixel portion of the first upper electrode overlapping the second lower electrode in the plan view, wherein the partition portion of the first transparent layer and the pixel portion of the first transparent layer are removed after the removing the partition portion of the second transparent layer and removing the pixel portion of the second transparent layer in a continuous removal operation by the same second dry etching;
   removing the partition portion of the first upper electrode and the pixel portion of the first upper electrode to expose a portion of the first organic layer by a first wet etching;
   removing the portion of the first organic layer by a third dry etching using the oxygen plasma, and
   removing the first patterned resist.

2. The manufacturing method of the display device according to claim 1, further comprising:
   after removing the first patterned resist,
      forming a second organic layer above the first lower electrode, on the second lower electrode and on the upper portion of the partition, the second organic layer including a second light-emitting layer and being in contact with the second lower electrode at the second aperture;

forming a second upper electrode on the second organic layer;

forming a third transparent layer on the second upper electrode, the third transparent layer being formed of a third organic material;

forming a fourth transparent layer on the third transparent layer, the fourth transparent layer being formed of a fourth organic material different from the third organic material;

forming a second sealing layer on the fourth transparent layer, the second sealing layer being formed of a third inorganic insulating material;

forming a second patterned resist on the second sealing layer, the second patterned resist covering a first portion of the second sealing layer above the second lower electrode and a second portion of the second sealing layer above a third part of the upper portion of the partition, and the second patterned resist exposing a third portion of the second sealing layer above the first lower electrode and a fourth portion of the second sealing layer above a fourth part of the upper portion of the partition;

removing the third portion of the second sealing layer to expose a portion of the fourth transparent layer by a fourth dry etching;

removing the portion of the fourth transparent layer to expose a portion of the third transparent layer by a fifth dry etching using the oxygen plasma;

removing the portion of the third transparent layer to expose a portion of the second upper electrode by the fifth dry etching;

removing the portion of the second upper electrode to expose a portion of the second organic layer by a second wet etching;

removing the portion of the second organic layer by a sixth dry etching using the oxygen plasma, and removing the second patterned resist, wherein the first light-emitting layer emits a light of a first color, and the second light-emitting layer emits a light of a second color different from the first color.

3. The manufacturing method of the display device according to claim 2, wherein a fourth refractive index of the fourth organic material is smaller than a third refractive index of the third organic material.

4. The manufacturing method of the display device according to claim 3, wherein a sixth refractive index of the second sealing layer is greater than the fourth refractive index of the fourth organic material.

5. The manufacturing method of the display device according to claim 2, wherein a third refractive index of the third organic material is greater than or equal to 1.7, and a fourth refractive index of the fourth organic material is less than or equal to 1.6.

6. The manufacturing method of the display device according to claim 2, wherein the forming the lower portion of the partition includes a sputtering deposition of a conductive material, and the forming the second upper electrode includes electrically contacting the second upper electrode to the lower portion of the partition.

7. The manufacturing method of the display device according to claim 2, wherein the forming the second upper electrode includes vapor depositing an alloy of magnesium and silver.

8. The manufacturing method of the display device according to claim 2, wherein the first organic material and the third organic material are a same organic material.

9. The manufacturing method of the display device according to claim 2, wherein the first organic material is different from the third organic material.

10. The manufacturing method of the display device according to claim 2, wherein the second organic material and the fourth organic material are a same organic material.

11. The manufacturing method of the display device according to claim 2, wherein the second organic material is different from the fourth organic material.

12. The manufacturing method of the display device according to claim 2, wherein a first thickness of the first transparent layer is equal to a third thickness of the third transparent layer.

13. The manufacturing method of the display device according to claim 2, wherein a first thickness of the first transparent layer is different from a third thickness of the third transparent layer.

14. The manufacturing method of the display device according to claim 2, wherein a second thickness of the second transparent layer is equal to a fourth thickness of the fourth transparent layer.

15. The manufacturing method of the display device according to claim 2, wherein a second thickness of the second transparent layer is different from a fourth thickness of the fourth transparent layer.

16. The manufacturing method of the display device according to claim 1, wherein a second refractive index of the second organic material is smaller than a first refractive index of the first organic material, the first upper electrode and the first transparent layer form a first interface, the first transparent layer and the second transparent layer form a second interface, and the first upper electrode, the first transparent layer, and the second transparent layer are arranged so that a first light emitted from the first light emitting layer is reflected a plurality of times at the first interface and the second interface before being transmitted through the second interface to enhance an intensity of the first light by a constructive optical interference.

17. The manufacturing method of the display device according to claim 16, wherein a fifth refractive index of the first sealing layer is greater than the second refractive index of the second organic material.

18. The manufacturing method of the display device according to claim 1, wherein a first refractive index of the first organic material is greater than or equal to 1.7, and a second refractive index of the second organic material is less than or equal to 1.6.

19. The manufacturing method of the display device according to claim 1, wherein the forming the lower portion of the partition includes a sputtering deposition of a conductive material, and the forming the first upper electrode includes electrically contacting the first upper electrode to the lower portion of the partition.

20. The manufacturing method of the display device according to claim 1, wherein the forming the first upper electrode includes vapor depositing an alloy of magnesium and silver.

* * * * *